(12) United States Patent
Saidaminov et al.

(10) Patent No.: US 10,504,659 B2
(45) Date of Patent: Dec. 10, 2019

(54) MULTIFUNCTIONAL OPTOELECTRONIC DEVICES BASED ON PEROVSKITES

(71) Applicant: KING ABDULLAH UNIVERSITY OF SCIENCE AND TECHNOLOGY, Thuwal (SA)

(72) Inventors: Makhsud I. Saidaminov, Thuwal (SA); Osman M. Bakr, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/086,530

(22) PCT Filed: Mar. 16, 2017

(86) PCT No.: PCT/IB2017/051535
§ 371 (c)(1),
(2) Date: Sep. 19, 2018

(87) PCT Pub. No.: WO2017/178905
PCT Pub. Date: Oct. 19, 2017

(65) Prior Publication Data
US 2019/0074140 A1 Mar. 7, 2019

Related U.S. Application Data

(60) Provisional application No. 62/321,794, filed on Apr. 13, 2016.

(51) Int. Cl.
*H01G 9/20* (2006.01)
*H01L 51/42* (2006.01)
*H01L 51/00* (2006.01)

(52) U.S. Cl.
CPC ....... *H01G 9/2009* (2013.01); *H01L 51/0002* (2013.01); *H01L 51/0077* (2013.01); *H01L 51/4206* (2013.01); *Y02E 10/549* (2013.01); *Y02P 70/521* (2015.11)

(58) Field of Classification Search
CPC .............. H01G 9/2009; H01L 51/0077; H01L 51/0002; H01L 51/4206; Y02P 70/521; Y02E 10/549
See application file for complete search history.

(56) References Cited

FOREIGN PATENT DOCUMENTS

KR 101546500 B1 8/2015

OTHER PUBLICATIONS

Baeg, K.J., et al., "Organic Light Detectors: Photodiodes and Phototransistors", Advanced Materials, Mar. 2013, pp. 4267-4295, vol. 25, Issue 31.
Burschka, J., et al., "Sequential deposition as a route to high-performance perovskite-sensitized solar cells", Nature, Jul. 2013, pp. 316-320, vol. 499.
Comin, R., et al., "Structural, optical, and electronic studies of wide-bandgap lead halide perovskites", Journal of Materials Chemistry C, Jul. 2015, pp. 8839-8843, Issue 34.

(Continued)

*Primary Examiner* — Anthony Ho
(74) *Attorney, Agent, or Firm* — Patent Portfolio Builders PLLC

(57) ABSTRACT

Embodiments of the present disclosure provide methods of growing halide films (e.g., single crystal halide perovskites or multi-crystal halide perovskites) on a structure, dual-mode photodetectors, methods of use, and the like.

14 Claims, 11 Drawing Sheets

(56) References Cited

OTHER PUBLICATIONS

Dar, M.I., et al., "Understanding the Impact of Bromide on the Photovoltaic Performance of CH3NH3Pbl3 Solar Cells", Advanced Materials, Oct. 2015, pp. 1-8, vol. 27, Issue 44.
Domanski, K., et al., "Working Principles of Perovskite Photodetectors: Analyzing the Interplay Between Photoconductivity and Voltage-Driven Energy-Level Alignment", Advanced Functional Materials, Oct. 2015, pp. 6936-6947, vol. 25, Issue 44.
Dong, R., et al., "High-Gain and Low-Driving-Voltage Photodetectors Based on Organolead Triiodide Perovskites", Advanced Materials, Jan. 2015, vol. 27, Issue 11.
Dou, L., et al., "Solution-processed hybrid perovskite photodetectors with high detectivity", Nature Communications, Nov. 2014, pp. 1-6.
Fang, Y.J., et al., "Highly Narrowband Perovskite Single-Crystal Photodetectors Enabled by Surface-Charge Recombination", Nature Photonics, Aug. 2015, pp. 1-9.
Guo, Y., et al., "Air-Stable and Solution-Processable Perovskite Photodetectors for Solar-Blind UV and Visible Light", The Journal of Physical Chemistry Letters, Jan. 2015, pp. 535-539.
Hu, X., et al., "High-Performance Flexible Broadband Photodetector Based on Organolead Halide Perovskite", Advanced Functional Materials, Sep. 2014, pp. 1-6, vol. 24, Issue 46.
Im, J.H., et al., "6.5% Efficient Perovskite Quantum-dot-sensitized Solar Cell", Nanoscale, Aug. 2011, pp. 4088-4093, vol. 3.
Jeon, N.J., et al., "Solvent engineering for high-performance inorganic-organic hybrid perovskite solar cells", Nature Materials, Jul. 2014, pp. 1-6.
Kadro, J.M., et al., "Facile route to freestanding CH3NH3Pbl3 crystals using inverse solubility", Scientific Reports, Jun. 2015, pp. 1-6.
Kim, H.S., et al., "Lead Iodide Perovskite Sensitized All-Solid-State Submicron Thin Film Mesoscopic Solar Cell with Efficiency Exceeding 9%", Scientific Reports, Aug. 2012, pp. 1-7, vol. 2, 591.
Kojima, A., et al., "Organometal Halide Perovskites as Visible-Light Sensitizers for Photovoltaic Cells", Journal of the American Chemical Society, Apr. 2009.
Konstantatos, G., et al., "Ultrasensitive solution-cast quantum dot photodetectors", Nature, Jul. 2006, pp. 180-183, vol. 442.
Lian, Z., et al., "High-Performance Planar-Type Photodetector on (100) Facet of MAPbl3 Single Crystal", Scientific Reports, Nov. 2015, pp. 1-10.
Liu, M., et al., "Efficient planar heterojunction pervoskite solar cells by vapour deposition", Nature, Sep. 2013, pp. 1-4, vol. 501.
Liu, Y., et al., "Two-Inch-Sized Perovskite CH3NH3PbX3 (X=Cl, Br, I) Crystals: Growth and Characterization", Advanced Materials, Aug. 2015, pp. 1-8, vol. 27, Issue 35.
Maculan, G., et al., "CH3NH3Pbl3 Single Crystals: Inverse Temperature Crystallization and Visible-Blind UV-Photodetector", The Journal of Physical Chemistry Letters, Sep. 2015, pp. 3781-3786.
Motta, C., et al., "Charge carrier mobility in hybrid halide perovskites", Scientific Reports, Aug. 2015, pp. 1-8.
Nie, W., et al., "High-efficiency solution-processed perovskite solar cells with millimeter-scale grains", Science, Jan. 2015, vol. 347, Issue 6221.
Noh, J.H., et al., "Chemical Management for Colorful, Efficient, and Stable Inorganic-Organic Hybrid Nanostructured Solar Cells", Nano Letters, Mar. 2013, pp. 1764-1769.
Saidaminov, M., et al., "High-quality bulk hybrid perovskite single crystals within minutes by inverse temperature crystallization", Nature Communications, Jul. 2015, pp. 1-6.
Shi, D., et al., "Low trap-state density and long carrier diffusion in organolead trihalide perovskite single crystals", Science, Jan. 2015, 347, 519.
Sutherland, B.R., et al., "Sensitive, fast, and stable perovskite photodetectors exploiting interface engineering", ACS Photonics, Jun. 2015.
Yakunin, S., et al., "Detection of X-ray photons by solution-processes lead halide perovskites", Nature Photonics, May 2015, pp. 1-7.
Zhang, T., et al., "A facile solvothermal growth of single crystal mixed halide perovskite CH3NH3Pb(Br1-xClx)3", Chem Communication, Mar. 2015, pp. 7820-7823.
Zhang, W., et al., "Highly Efficient Perovskite Solar Cells with Tuneable Structural Color", Nano Letters, Feb. 2015.
Armin, A., et al., "Narrowband Light Detection Via Internal Quantum Efficiency Manipulation of Organic Photodiodes," Nature Communications, Feb. 27, 2015, vol. 6, pp. 6343-6350.
Hu, X., et al., "High-Performance Flexible Broadband Photodetector Based on Organolead Halide Perovskite," Advanced Functional Materials, Dec. 10, 2014, vol. 24, No. 46, pp. 7373-7380, Wiley-VCH Verlag GmbH & Co. KGaA, Weinheim.
International Search Report in related International Application No. PCT/IB2017/051535, dated Jul. 10, 2017.
Kwon, K.C., et al., "Inhibition of Ion Migration for Reliable Operation of Organolead Halide Perovskite-Based Metal/Semiconductor/Metal Broadband Photodetectors," Advanced Functional Meterials, Mar. 21, 2016, vol. 26, No. 23, pp. 4213-4222, Wiley-VCH Verlag GmbH & Co. KGaA, Weinheim.
Lin, Q., et al., "Filterless Narrowband Visible Photodetectors," Nature Photonics, Jan. 1, 2015, vol. 9, No. 10, pp. 687-694, Macmillian Publishers Limited.
Saidaminov, M.I., et al., "Perovskite Photodetectors Operating in Both Narrowband and Broadband Regimes," Jul. 7, 2016, vol. 28, No. 37, pp. 8144-8149, Wiley-VCH Verlag GmbH & Co. KGaA, Weinheim.
Written Opinion of the International Searching Authority in related International Application No. PCT/IB2017/051535, dated Jul. 10, 2017.
Notice of Reasons for Rejection in corresponding/related Japanese Patent Application No. 2018-554034, dated Mar. 13, 2019 (References 1, 2 and 5 were provided with the IDS filed Sep. 19, 2018).
Saidaminov, M.I., et al., "Planar-Integrated Single-Crystalline Perovskite Photodetectors," Nature Communications, Nov. 9, 2015, vol. 6, Article No. 7586, pp. 1-6.
Wang, W., et al., "Organic Photodetectors with Gain and Broadband/Narrowband Response under Top/Bottom Illumination Conditions," Advanced Optical Materials, Jun. 10, 2018, vol. 6, pp. 1800249-1-1800249-8.

US 10,504,659 B2

MULTIFUNCTIONAL OPTOELECTRONIC DEVICES BASED ON PEROVSKITES

CROSS-REFERENCE TO RELATED APPLICATIONS

This application is a U.S. National Stage of International Application No. PCT/IB2017/051535, filed on Mar. 16, 2017, which claims the benefit of and priority to U.S. Provisional Application Ser. No. 62/321,794, having the title "MULTIFUNCTIONAL OPTOELECTRONIC DEVICES BASED ON PEROVSKITES," filed on Apr. 13, 2016, the disclosures of which are incorporated herein in by reference in their entirety.

BACKGROUND

Photodetectors are generally classified into two groups: wideband photodetectors (WBPs) and narrowband photodetectors (NBPs). WBPs are used to sense a wide spectrum of light, e.g., visible-light, UV-light and X-rays, while NBPs are used to detect only a narrow range of light, e.g., red, green, blue, or a selective portion of infrared. Due to the selectivity of the latter, they are used in remote controlling, biomedical sensing, defense applications, communications and surveillance. In addition, photodetectors can operate only in one regime—either in the wideband or in the narrowband limiting their broader applications.

SUMMARY

Embodiments of the present disclosure provide methods of growing halide films (e.g., single crystal halide perovskites or multi-crystal halide perovskites) on a structure, dual-mode photodetectors, methods of use, and the like.

An embodiment of the present disclosure is directed to a device, among others, that includes: a dual-band photodetector having a microcrystalline film deposited on a substrate, wherein the microcrystalline film is positioned on a top side and the substrate is positioned on a bottom side, wherein the microcrystalline film is a halide perovskite, wherein the dual-band photodetector is configured to operate as a narrow-band photodetector upon illumination from the top side and the dual-band photodetector is configured to operate as a wide-band photodetector upon illumination from the bottom side. In an embodiment, the halide perovskite is $AMX_3$, wherein A is an inorganic or organic monovalent cation, M is a divalent cation selected from the group consisting of: Pb, Sn, Cu, Ni, Co, Fe, Mn, Pd, Cd, Ge, Cs, or Eu, and X is selected from a halide. In an embodiment, substrate is selected from indium tin oxide (ITO), fluorinated tin oxide (FTO), or gold.

An embodiment of the present disclosure is directed to a photodetector, among others, that includes: providing precursor materials for a microcrystalline film; and depositing a microcrystalline film on a substrate to form a dual-band photodetector such as those described herein.

Other compositions, methods, features, and advantages will be or will become apparent to one with skill in the art upon examination of the following drawings and detailed description. It is intended that all such additional compositions, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

DETAILED DESCRIPTION

Figure 1A:
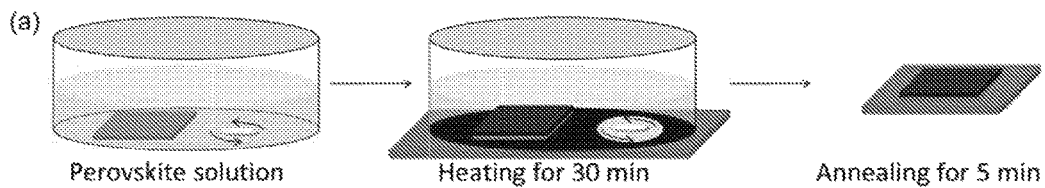
FIG. 1A is a schematic of the microcrystalline film growth process. A perovskite solution is continuously perturbed by stirring at 110° C. for 30 min to form a microcrystalline film; then the film is annealed to remove residual solvents.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, synthetic organic chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 25° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

General Discussion

Embodiments of the present disclosure provide methods of growing halide films (e.g., single crystal halide perovskites or multi-crystal halide perovskites) on a structure, dual-mode photodetectors, methods of use, and the like. Embodiments of the present disclosure provide for a method of making halide films on a substrate such as tin indium oxide (ITO) that is simple and fast, where the resultant structure can be used as a dual-mode photodetector. In addition, the dual-mode photodetector can be tunable by modifying the composition of the halide film.

Figure 12:
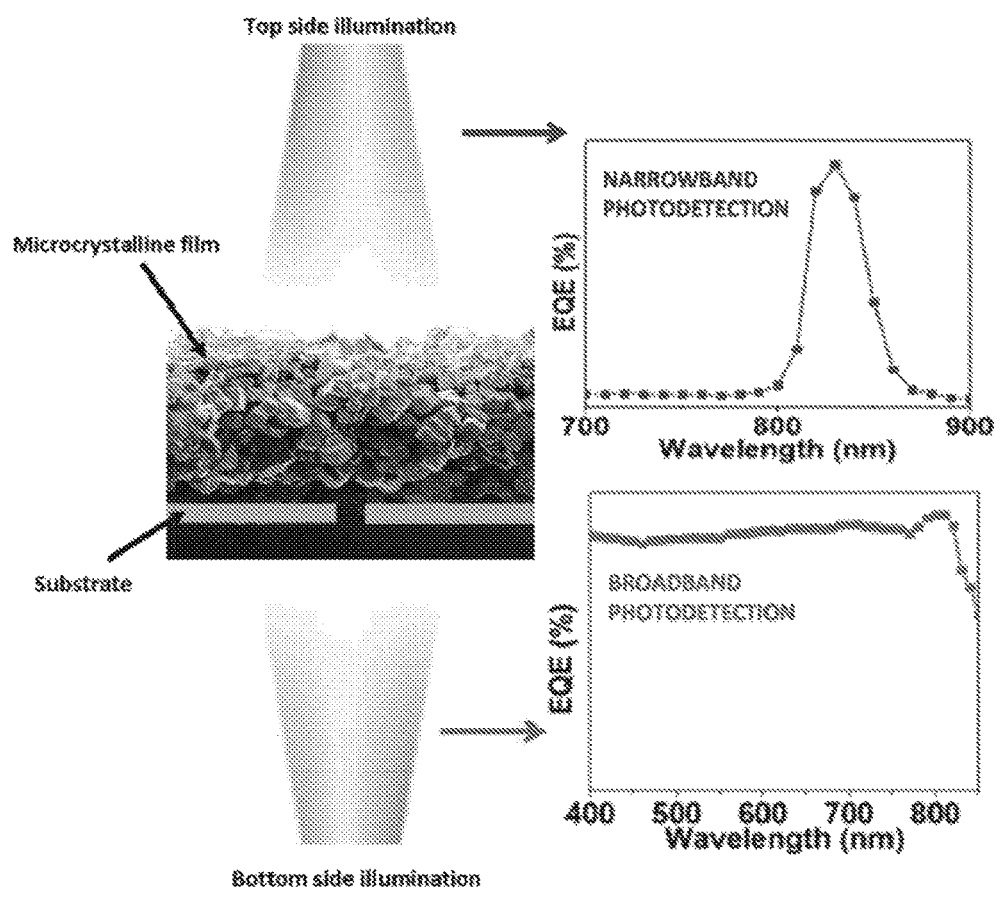
FIG. 12 illustrates an embodiment of dual-mode photodetector and graphs illustrating the narrowband and broadband detection.

In an embodiment of the device, the dual-band photodetector includes a microcrystalline film deposited on a substrate. The microcrystalline film is positioned on a top side and the substrate is positioned on a bottom side of the dual-band photodetector. The dual-band photodetector can operate as a narrow-band photodetector or as a wide-band photodetector based upon the exposure to the light energy. In an embodiment, the wavelengths that can be detected by the dual-band photodetector can be tuned by changing the chemical composition of the halide perovskite (e.g., changing the halide composition (e.g., include different halides in the halide perovskite or by changing to a different halide between compositions). An illustrative embodiment of the dual-band photodetector is shown in FIG. 12.

In an embodiment, the dual-band photodetector is configured to operate as a narrow-band photodetector upon illumination from the top side, or in other words the illumination is directed onto the microcrystalline film. While operating as the narrow-band photodetector, the dual-band photodetector is configured to detect light in the red, green, blue, and near-infrared portion of the infrared. The dual-band photodetector can be configured to detect wavelengths of the red spectrum ranging from 625-740 nm, wavelengths of the green spectrum ranging from 530-570 nm, wavelengths of the blue spectrum ranging from 470-500 nm, and wavelengths of the near-infrared ranging from 810-850 nm. In an embodiment, the dual-band photodetector can have an external quantum efficiency of about 10% to $10^4$% or more under a bias of about 1 to 10V when operating as a narrow-band photodetector. The operation spectrum of dual-photodetectors can be tuned continuously from 400 nm to 850 nm.

In an embodiment, the dual-band photodetector is configured to operate as a wide-band photodetector upon illumination from the bottom side, or in other words the illumination is directed onto the substrate. While operating as the wide-band photodetector, the dual-band photodetector is configured to detect light in the visible, UV-light, and X-ray, regions of the light spectrum. For example, the $MAPbI_3$-based photodetector senses all visible light including near-infrared up to about 820 nm. In an embodiment, the dual-band photodetector can have an external quantum efficiency of about 10% to about $10^5$% or more under a bias of about 1 V to about 10V when operating as a wide-band photodetector.

In an embodiment, the microcrystalline film can be a halide perovskite. In an embodiment, the halide perovskite can be a single crystal halide perovskite, microcrystalline halide perovskites or a polycrystalline halide perovskite. In an embodiment, the halide perovskite can be doped.

In an embodiment, the halide structure can have the following formula: $AMX_3$. In an embodiment, A can be an organic cation such as alkyl-ammonium (e.g., methylammonium (MA)), formamidinum (FA), 5-ammoniumvaleric acid, or an inorganic cation such Cesium (Cs), or a combination thereof. In an embodiment, M can be a cation or divalent cation of an element such as Pb, Sn, Cu, Ni, Co, Fe, Mn, Pd, Cd, Ge, Cs, or Eu. In a particular embodiment, M is Pb. In an embodiment, X can be a halide anion such as Cl, Br, F, and I. In an embodiment, each X can be the same, while in another embodiment, each X can be independently selected from a halide anion. In particular, X is I or Br or Cl. The selection of the components of $AMX_3$ is made so that the halide has a neutral charge. In an embodiment, alkyl can refer to linear or branched hydrocarbon moieties having one to six carbon atoms (e.g., methyl, ethyl, propyl, and the like).

In an embodiment, $AMX_3$ can be: methylammonium lead iodide ($MAPbI_3$), methylammonium lead bromide ($MAPbBr_3$), formamidinum lead bromide ($FAPbBr_3$), formamidinum lead iodide ($FAPbI_3$), $MAPbCl_3$, $MAPbBr_2Cl$, $FAPbCl_3$, $CsPbI_3$, $CsPbCl_3$, $CsPbBr_3$, $CsSnI_3$, $CsSnBr_3$, $CsSnCl_3$, $FASnBr_3$, $FASnCl_3$, $FASnI_3$, $MASnBr_3$, $MASnCl_3$, and $MASnI_3$.

In an embodiment, the $AMX_3$ structure can be a single crystal halide perovskite. In an embodiment, the $AMX_3$ structure can have a thickness of about 5 to 1000 microns, about 10 to 500 microns, about 100 to 500 microns, about 100 to 300 microns, or about 200 microns. In an embodiment, the length and width can be on the micron scale to cm scale or larger, and can be designed based on the particular use. In an embodiment, the halide perovskite can have cubic-shaped solids having a length, width, and height of about 5 to 10 microns.

In an embodiment, the halide perovskite film is disposed on the substrate. In an embodiment, the substrate can be a conductive substrate such as indium tin oxide, fluorinated tin oxide (FTO), or a metal (e.g., gold, silver, copper, platinum, and the like). In an embodiment, the substrate can have a thickness of about 1 to about 1000 nm or on the mm scale. In an embodiment, the length and width can be on the micron scale to cm scale or larger, and can be designed based on the particular use.

An embodiment of the present disclosure includes a method of making a microcrystalline film, in particular a halide perovskite single crystal film, as described herein. The method is simple, the component set up is not complex and does not require specialized equipment, the time of reaction is an order of magnitude shorter than other methods, and the reaction requires little energy input.

In an embodiment, the method includes dissolving $MX_2$ and AX in a solvent to form dissolved $APbX_3$ in a container at or near room temperature. The substrate and the solution are in a container so that the microcrystalline film can form on the substrate. In an embodiment, the solubility can be enhanced using a vortex mixer. In an embodiment, undissolved $MX_2$ or AX can be filtered out. In an embodiment, A can be an organic cation. In an embodiment, the concentration of the $MX_2$ can be about 4 to 44 weight %. In an embodiment, the concentration of the AX can be about 2 to 15 weight %.

In an embodiment, M can be selected from: Pb cation, Sn cation, Cu cation, Ni cation, Co cation, Fe cation, Mn cation, Pd cation, Cd cation, Ge cation, or Eu cation, Cs cation, and in a particular embodiment, M can be $Pb^{2+}$. In an embodiment, X can be a halide such as $Br^-$, $Cl^-$, or $I^-$. In an embodiment, A is a cation selected from methyl-ammonium, formamidinium, and Cesium (Cs).

In an embodiment, the solvent can be N,N-dimethylformamide (DMF), dimethylsulfoxide (DMSO), gamma-butyrolactone (GBL), dichlorobenzene (DCB), toluene, or a combination thereof, depending upon the $AMX_3$ structure to be formed.

Subsequently, the mixture in the solvent is heated to a temperature (e.g., about 40 to 150° C.) so that the microcrystalline film (e.g., $APbX_3$ structure) forms, where the temperature corresponds to the inverse temperature solubility for dissolved microcrystalline film (e.g., $APbX_3$). In an embodiment, the $APbX_3$ structure can be formed in about 0.5-3 h. Additional details are provided in the Example.

In an embodiment, the solvent is matched with the reactants so that at room temperature the reactants are soluble in the solvent, but at higher temperatures, the $APbX_3$ structure is formed (e.g., crystalizes). In this regard, when a $MAPbBr_3$ perovskite structure is to be formed, the solvent used is N,N-dimethylformamide (DMF). In another embodiment, when a $MAPbI_3$ perovskite structure is to be formed, the solvent is γ-butyrolactone (GBL). In another embodiment, when a $MAPbCl_3$ perovskite structure is to be formed, the solvent is dimethylsulfoxide (DMSO) and DMF (1:1 ratio).

In an embodiment, the microcrystalline film (e.g., $APbX_3$ structure) can be doped by adding a dopant such as bismuth, gold, indium, tin germanium, phosphine, copper, strontium, cadmium, calcium, and/or nickel ions (2+ and 3+ cations as appropriate) to the reaction process by added these to the precursor solution. In an embodiment, the atomic % of the dopant can be about 0.0001 to 5%.

In an embodiment, after microcrystalline film (e.g., $APbX_3$ structure) formed, the diluted dissolved $APbX_3$ can be replenished so that a larger $APbX_3$ structure can be grown. This process can be repeated to form the desired size of the $APbX_3$ structure. In an embodiment, the dissolved $APbX_3$ can be replenished by removing the diluted mixture from the container, and mixing in fresh dissolved $APbX_3$ or adding in the reactants to form the dissolved $APbX_3$.

In an embodiment the method can be designed to control the temperature to which the mixture is subjected in the container. In general, the temperature is controlled by a heating solution in contact with the outside of the container (e.g., an oil bath), which can be adjusted to control the rate of formation of the halide structure, the size of the halide structure, and the like.

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Recent pioneering works on the integration of hybrid perovskites ($MAPbX_3$, MA=$CH_3NH_3^-$, X=$Cl^-$, $Br^-$ or/and $I^-$) in solar cells[1] drew the attention of a broad community of researchers, varying from material chemists to device engineers. The facile solution processability and the semiconducting properties of perovskites enabled scientists to fabricate many types of optoelectronic devices in an efficient manner.[2] In particular, scientists utilized the high charge carrier mobility, long diffusion length, low dark current, and sharp absorption edge of hybrid perovskites to fabricate solution processed, fast and sensitive photodetectors.[3] Moreover, the absorption edge of $MAPbX_3$ can be continuously tuned from UV to NIR through manipulating the halide composition[4]—an important property for tunable photodetectors.

Photodetectors—the vital components of modern imaging and communication systems—are generally classified into two groups: wideband photodetectors (WBPs) and narrowband photodetectors (NBPs). WBPs are used to sense a wide spectrum of light, e.g., visible-light[3, 5], UV-light[6] and X-rays[7], while NBPs are used to detect only a narrow range of light, e.g., red, green, blue, or a selective portion of infrared[8]. Due to the selectivity of the latter, they are used in remote controlling, biomedical sensing, defense applications, communications and surveillance.[9] Perovskite WBPs[3, 6] and NBPs[8a, 8b] have been demonstrated using both polycrystalline films and single crystals. The external quantum efficiency (EQE) of current perovskite-based WBPs reaches ~$10^5$%,[3h, 10], while that of NBPs reaches only tens of %, indicating that there is still a large margin left for improving the sensitivity of NBPs. Additionally, photodetectors in general can operate only in one regime—either in the wideband or in the narrowband—limiting their broader applications. Realizing photodetectors that can sense photons with high EQE in both regimes would introduce a new level of versatility to optoelectronics.

Here, we design photodetectors that operate efficiently in both wideband and narrowband regimes. To realize these bifunctional devices, we developed a procedure to rapidly grow perovskite microcrystals on a patterned ITO substrate. Our photodetectors sense a wide spectrum of light upon bottom illumination (from ITO side), that is they operate in the wideband regime. Upon top illumination (from air/perovskite side), the same photodetectors sense only a narrow fraction of photons, that is they operate in the narrowband regime. In particular, our NBPs show high EQE (above $10^4$%) relative to other perovskite-based NBPs. Moreover, the operational spectrum of photodetectors can be tuned by adjusting the perovskite composition $AMX_3$, such as halide (X) composition and/or A and NI compositions in the perovskite framework. To the best of our knowledge, this is the first demonstration of photodetectors (made of perovskites and non-perovskites) that can operate in both regimes without an optical filter. Our findings open the door towards realizing a new class of bifunctional solution-processed photodetectors potentially suitable for narrowband and wideband light detection.

We began our study by developing a method to grow $MAPbI_3$ microcrystalline films. Our method combines the advantages of the rapidity of the inverse temperature crystallization (that was originally developed to grow rapidly free-standing single crystals)[11] and the device integrability of the solution perturbation technique,[3b] as shown in FIG. 1A. Briefly, the perovskite solution and the substrates were placed in a crystallization dish that was then heated to a fixed temperature under constant perturbation with a stirring force (see Methods for details). At the appropriate temperature, nucleation starts in 5 min. To continue the growth of crystalline films, we kept the substrates in the solution for an additional 25 min. Then the substrates with the microcrystalline perovskite films were removed from the solution and were annealed to remove the residual solvents. Note that the growth of microcrystalline films does not require lattice matching with the underlying substrate, enabling potential integration of the films into existing fabrication technology.

Figure 1B:
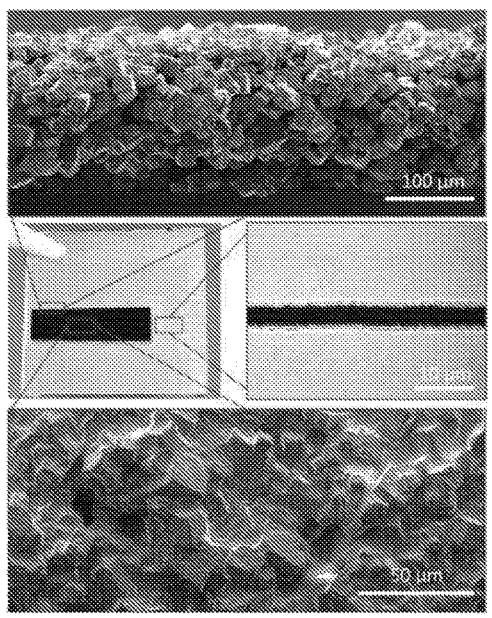
FIG. 1B is a photo of the device (middle-left) and optical microscope image of the pre-patterned ITO substrate (middle-right), and cross-sectional (up) and top (down) SEM images of the $MAPbI_3$ microcrystalline film.
Figure 1C:
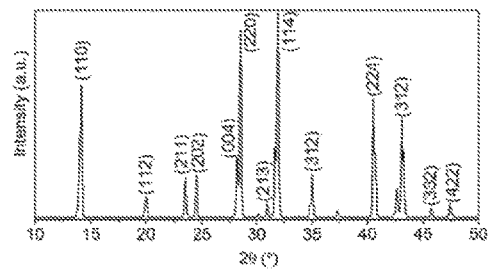
FIG. 1C demonstrates the XRD pattern of the microcrystalline film, confirming a single phase of tetragonal $MAPbI_3$.
Figure 1D:
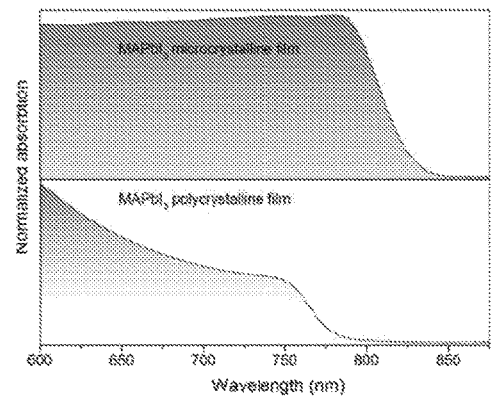
FIG. 1D shows the absorption spectra of microcrystalline (top) and polycrystalline (bottom) $MAPbI_3$ films, showing the wider absorption range of the microcrystalline films.

The cross-sectional scanning electron microscopy (SEM) image showed that the optimized $MAPbI_3$ microcrystalline film has a thickness of ~200 μm (see below for more details about the optimized thickness) and is composed of ~5-10 μm cubic-shaped solids (FIG. 1B). The top-view SEM image revealed that the surface layer of the film with a thickness of 200 μm resembles the morphology of the polycrystalline films (FIG. 1B). X-ray diffraction (XRD) confirmed that the film is a single phase tetragonal $MAPbI_3$ (FIG. 1C). The absorption spectra showed that the band edge of $MAPbI_3$ microcrystalline film is located at ~830 nm (FIG. 1D), a value that closely matches with that of $MAPbI_3$ single crystal.[11a] By contrast, $MAPbI_3$ polycrystalline film prepared by "solvent-engineering"[12] has an absorption edge at 780 nm (FIG. 1D), which is blue-shifted by 50 nm compared to that in microcrystalline films. This difference was previously attributed to the tighter structurally coherent units in the single crystals than in polycrystalline films.[13]

Figure 2A:
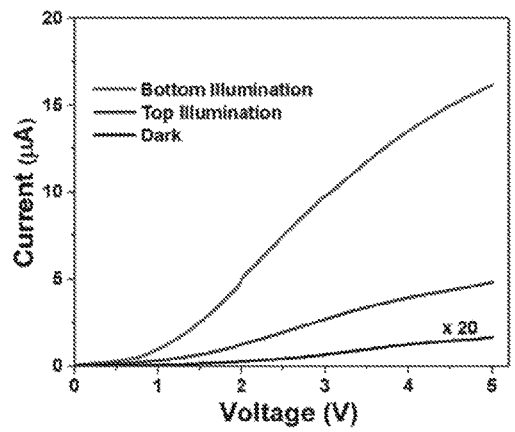
FIG. 2A shows the photocurrent of the $MAPbI_3$ microcrystalline (thickness: 200 µm) photodetector under white-light illumination of 0.5 mW/cm². Inset: dark current.

The structural asymmetry, i.e., predominantly surface-located polycrystalline films on microcrystalline films and the difference in their absorption edges, led us to postulate that the microcrystalline films will electronically behave differently upon bottom and top illuminations. To check this postulation, we fabricated metal-semiconductor-metal photodetectors by depositing microcrystalline films on patterned ITO substrates with channel length and width of 5 μm and 1000 μm, respectively (FIG. 1B). FIG. 2A shows the dark current and photocurrent of our devices upon top and bottom illuminations with white light of 0.5 mW/cm². All I-V curves show a rectifying nature, indicating a Schottky contact between the microcrystalline film and the ITO electrodes.[3b] In addition to the low dark current (2.9 nA at 1 V), this result indicates that a considerable amount of photocurrent can be generated under light.

Figure 2B:
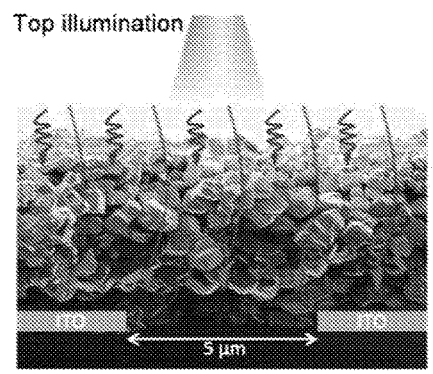
FIG. 2B is a schematic illustrating the narrowband photodetection mechanism.

Interestingly, we observed that the fabricated photodetectors show a wideband spectral response upon bottom illumination (from ITO side) and a narrowband spectral response upon top illumination (from air/perovskite side). It is straightforward to rationalize the wide spectral response of the perovskite photodetector upon bottom illumination because above-bandgap photons can generate charge carriers at the vicinity of the electrodes, which is followed by efficient charge collection. This mechanism leads to a wideband photodetection behaviour and was recently used to design high gain perovskite WBPs[3b]. In contrast, upon top illumination, short-wavelength photons generate charge carriers mostly near the surface, as these above-bandgap photons cannot penetrate the whole thick (200 μm) film to reach the ITO electrodes due to the large absorption coefficient of perovskites. This results in increased carrier recombination, diminishing the collection efficiency of carriers generated by short-wavelength photons. Meanwhile, long-wavelength photons with energy comparable to the bandgap can penetrate deeper into the film to generate charge carriers that are effectively collected by the electrodes under the applied electric field. FIG. 2B depicts this mechanism, termed charge collection narrowing (CCN)[14], which leads to a narrowband photodetection behaviour. CCN was recently discovered in perovskites and successfully used to design NBPs[8a, 8b].

Figure 2C:
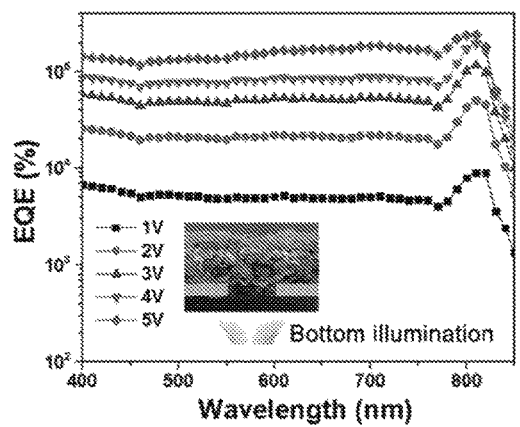
FIG. 2C shows EQE of the photodetector upon bottom illumination, showing the WBP behaviour.

First, we studied the performance of the photodetectors upon bottom illumination. As expected, a wide spectrum of photons could efficiently generate photocurrent, resulting in WBPs. FIG. 2C shows an EQE of ~8×$10^3$% under a bias of 1 V and increases to 2×$10^5$% (corresponding to a responsivity of 1640 A/W and a gain of 2509 at 810 nm (FIG. 4A-B)) under a bias of 5 V. In general, EQE is below 100% under low voltage bias because the dominant charges are photogenerated. But in the presence of high voltage bias, which leads to strong charge injection from electrodes, the EQE can go well above 100%.[3c] High EQE values under bias have been previously realized in perovskite photodetectors[3c, 3h, 3j, 10]. We will return later to the origin of high gain in our photodetectors.

Figure 2D:
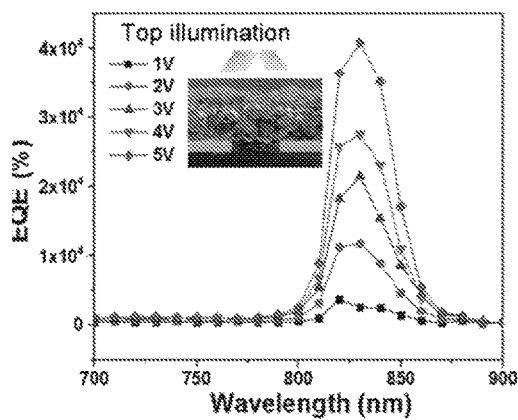
FIG. 2D shows EQE of the photodetector upon top illumination, showing the NBP behaviour.

Next, we studied the performance of photodetectors upon top illumination. As shown in the mechanism presented in FIG. 2B, only long wavelength photons near the band edge are capable to generate photocurrent, resulting in NBPs. FIG. 2D shows that EQE of our NBPs reaches ~$10^4$% (corresponding to a responsivity of 275 A/W and a gain of 409 (FIG. 4A-B)) at 830 nm under 5 V bias. To the best of our knowledge, these values are the highest numbers for perovskite NBPs reported to date. The full-width at half-maximum (FWHM) of the EQE peak is ~33 nm. Moreover, our NBPs preserved their narrowband detection ability within a wide range of bias voltages, making them suitable candidates to be integrated with other electronic components for narrowband photodetection.

Figure 4A:
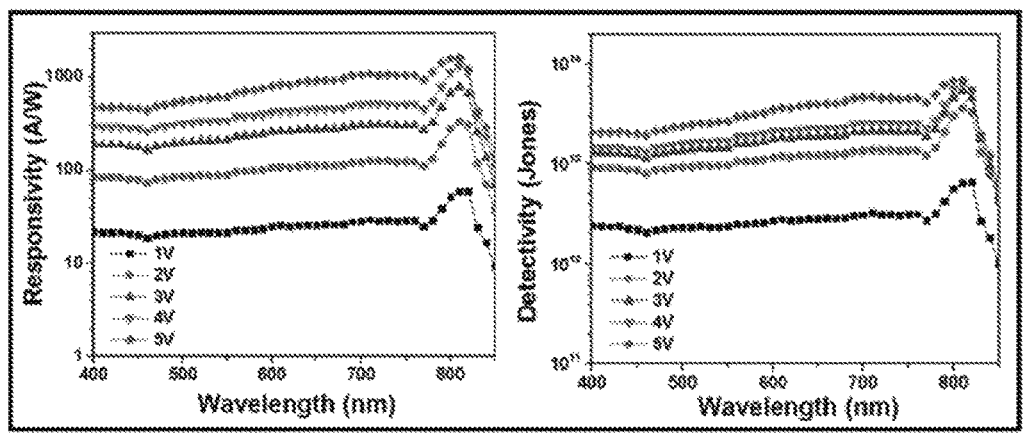
FIG. 4A shows responsivity and detectivity of microcrystalline $MAPbI_3$ photodetectors upon top illumination representing narrowband photodetection regime.
Figure 4B:
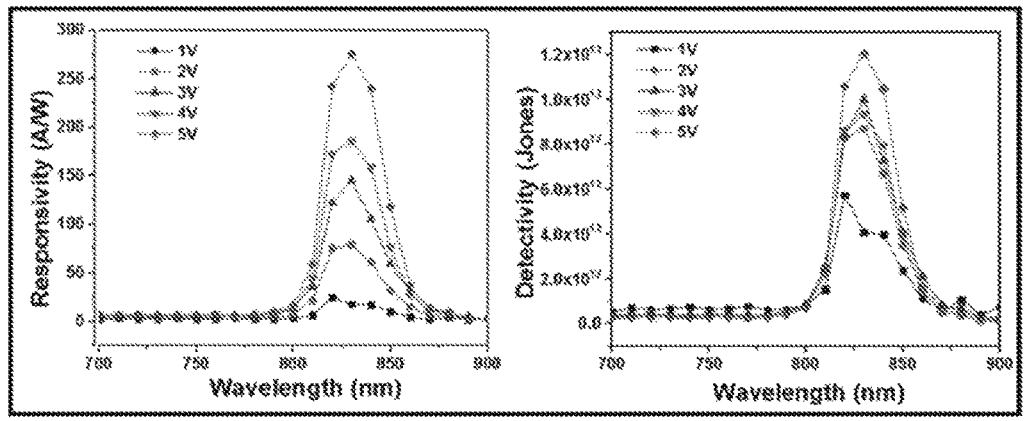
FIG. 4B shows responsivity and detectivity of microcrystalline $MAPbI_3$ photodetector upon bottom illumination representing wide-band photodetection regime.
Figure 5A:
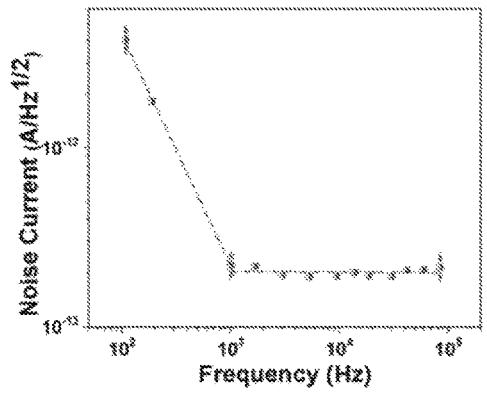
FIG. 5A illustrates noise current of photodetector as a function of frequency.
Figure 5B:
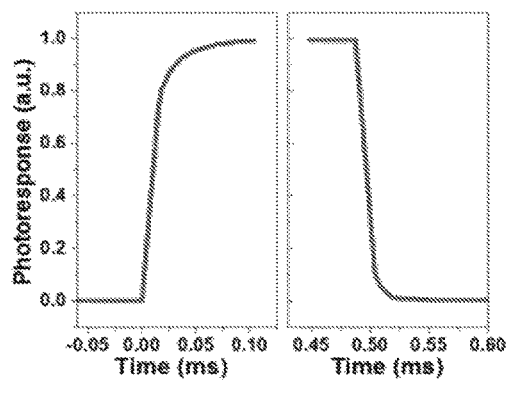
FIG. 5B shows the time response of microcrystalline $MAPbI_3$ photodetector.
Figure 6:
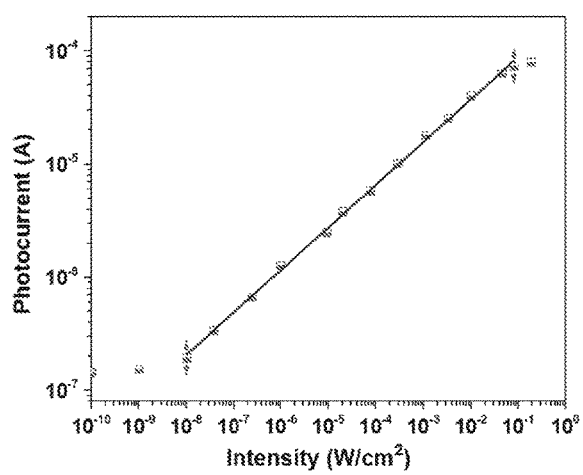
FIG. 6 illustrates the dynamic response of the photodetector upon bottom illumination (ITO side) with a 532 nm laser at 5 V bias.
Figure 7:
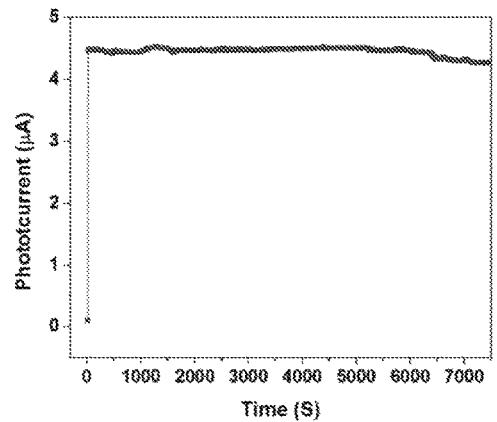
FIG. 7 shows the photocurrent stability of a device measured under a bias of 5 V under continuous top illumination (air side) of 0.5 mW/cm² after three weeks of storage in the ambient conditions with a relative humidity of 55%.

Both WBPs and NBPs showed detectivity of ~$10^{13}$ jones (FIGS. 4A-B). The measured noise current (FIGS. 5A-B) was small and exhibits a pink noise component ($1/f$) at lower frequencies.[3h] Importantly, these photodetectors also exhibited high response speed: the rise and fall response times were approximately 30 μs and 20 μs, respectively (FIGS. 5A-B). As another important parameters of the photodetectors, their photocurrent response under varied light intensity was measured, exhibiting a linear dynamic range (LDR) of ~70 dB (FIG. 6). These figures of merit are comparable to the best performing perovskite photodetectors reported to date. To check the stability of our photodetectors, we measured the photocurrent of a device under continuous topside illumination of 0.5 mW/cm$^2$ after three weeks of storage in ambient conditions at a relative humidity of 55% (FIG. 7). Notably, our photodetectors showed consistent performance after such a long storage time, indicating their long-term stability. Overall, we demonstrated that the microcrystalline perovskite photodetectors operate in the wideband and narrowband regimes upon bottom and top illuminations, respectively, with high photodetection performance.

The high performance of our photodetectors is directly related to their high photoconductive gain. Gain of a photodetector is generally equal to the ratio of the carrier recombination lifetime ($\tau_{lifetime}$) and the transit time ($\tau_{transit}$): Gain=$\tau_{lifetime}/\tau_{transit}$. The carrier recombination lifetime can be approximated from the time response of the photodetector, which is ~20 μs (FIGS. 5A-B). The photocarrier transit time is directly proportional to the square of the channel width (d) and inversely proportional to the carriers mobility (μ) and the applied bias (V): $\tau_{transit}=d^2\mu^{-1}V^{-1}$.[15] Since the channel width d is 5 μm (FIG. 1B), the applied bias V is 5 V, and assuming the carrier mobility μ of 5-10 cm$^2$V$^{-1}$s$^{-1}$[16], the transit time is as short as 5-10 ns. Consequently, the estimated gain is in the range of 2000-4000, which agrees well with the gain calculated from the responsivity data. Such a high photoconductive gain could be the consequence of light-modulated carrier trapping at the perovskite-ITO interface, and the lowering of the interfacial Schottky barrier under illumination effectively results in more efficient charge extraction and photoresponse.[3c, 3f, 14]

Figures 8A, 8B, 8C:
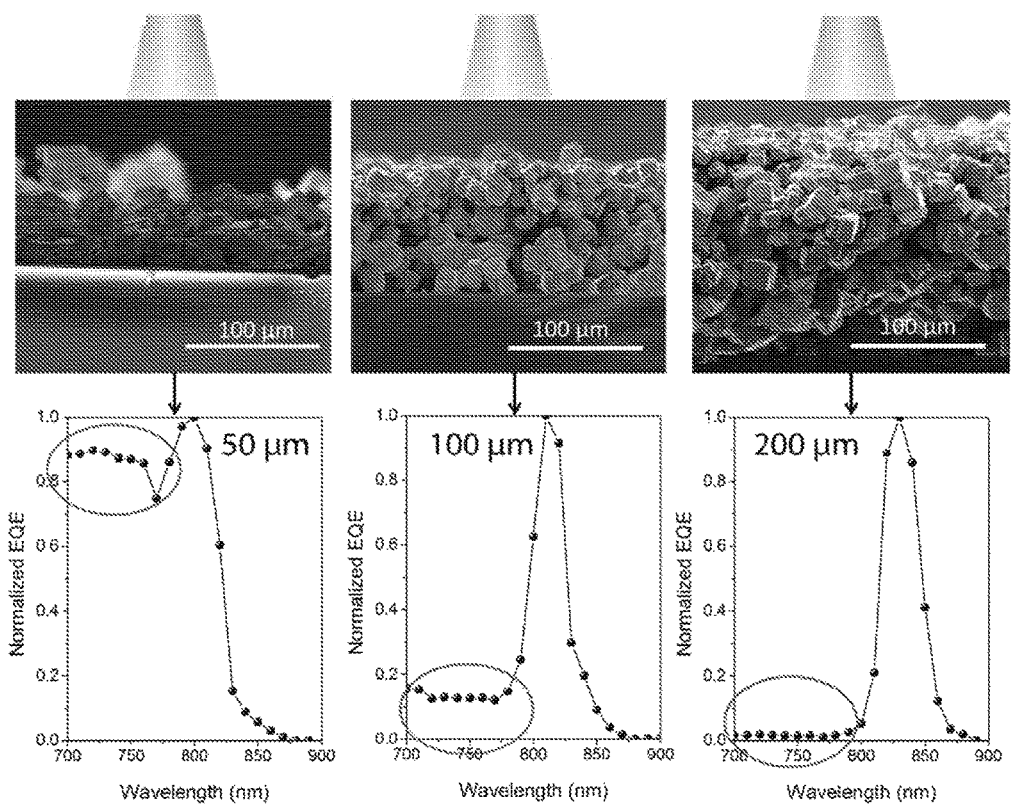
FIGS. 8A-C illustrate thickness-dependent NBPs response upon top illumination for perovskite layer thickness of 8A) 50 µm 8B) 100 µm and 8C) 200 µm. The photocurrent from short wavelength photons gets suppressed (red ovals) by increasing the thickness of microcrystalline films.

We now turn to the mechanism of narrowband photodetection in our photodetectors to show that it is related to the CCN and the surface-located polycrystalline film. To reveal the effect of CCN on the NBP's response, we studied the thickness dependence of the photoresponse upon top illumination. The comparative EQEs for 50, 100 and 200 μm perovskite films are shown in FIGS. 8A-B. The 50 μm film did not show any narrowband behaviour, while the 100 μm films showed narrowband photodetection with substantial photoresponse in the short wavelength (<775 nm) regime (FIG. 8B). In contrast, the 200 μm film exhibited much improved narrowband detection by suppressing the short wavelength photoresponse; therefore, we chose the optimized thickness of 200 μm microcrystalline perovskite films for all characterizations. Such a thickness dependence of narrowband photoresponse upon top illumination unambiguously suggests the CCN effect in tuning the photodetection[8b, 14]. It is worth mentioning that the overall photocurrent of NBPs decreases with the increase of perovskite film thickness, which is a result of the suppressed absorption at low wavelength and larger resistance associated with thicker films. We also note that the photocurrent of devices upon bottom illumination, i.e. the WBPs performance, is not affected by the thickness of the perovskite films.

Figure 9A:
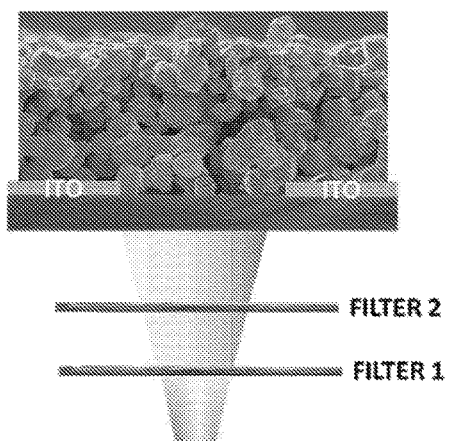
FIGS. 9A-B show EQE of WBPs becomes narrow by using polycrystalline $MAPbI_3$ films as filters on microcrystalline $MAPbI_3$ photodetectors.
Figure 9B:
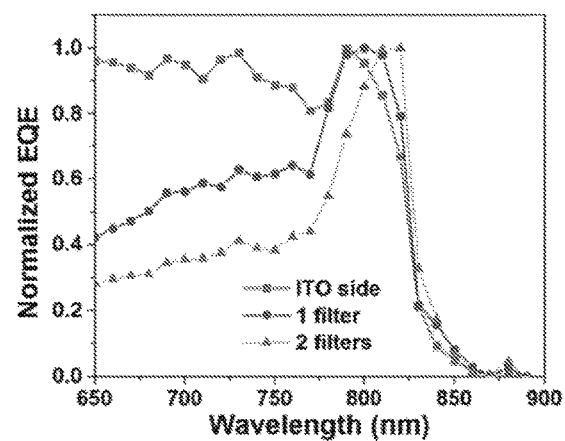
Figure 10A:
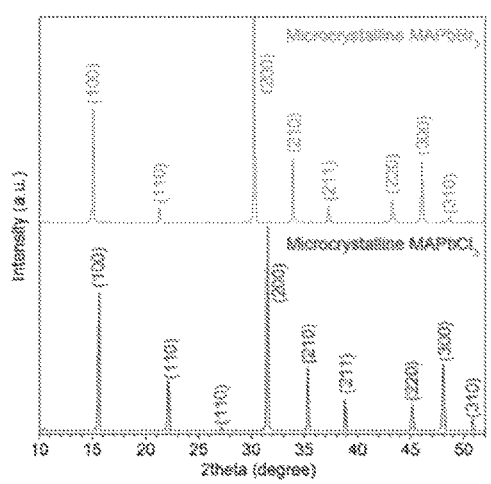
FIG. 10A shows XRD and 10B shows absorption profiles of microcrystalline $MAPbBr_3$ and $MAPbCl_3$ films.
Figure 10B:
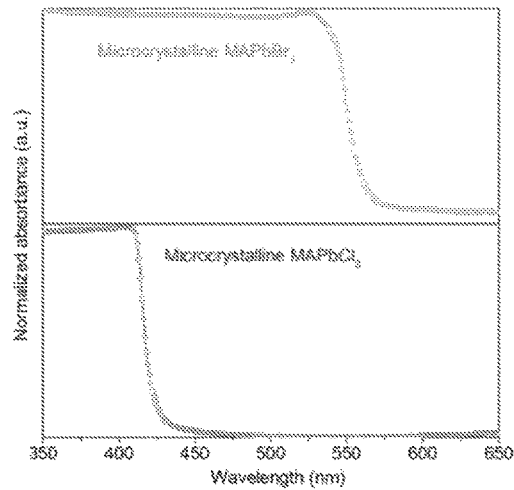

In addition, the surface-located polycrystalline film plays a role in the narrowband photoresponse. To reveal its effect, we studied the photodetector response upon bottom illumination while placing a polycrystalline film in the light path (FIG. 9A). The polycrystalline film works as a filter, blocking the short wavelength photons, while transmitting the long wavelength ones; consequently, only the long wavelength photons generate photocurrent in the microcrystalline films, thus leading to narrowband detection instead of wideband behaviour even under the bottom illumination (FIG. 9B). As expected, an increase in the number of polycrystalline film filters further narrows the detection wavelength range (FIG. 9B), providing an additional parameter to tune the photoresponse. Thus, we conclude that in the present case, the narrowband photodetection was realized due to the combined effect of CCN and surface-located polycrystalline film.

Figure 3:
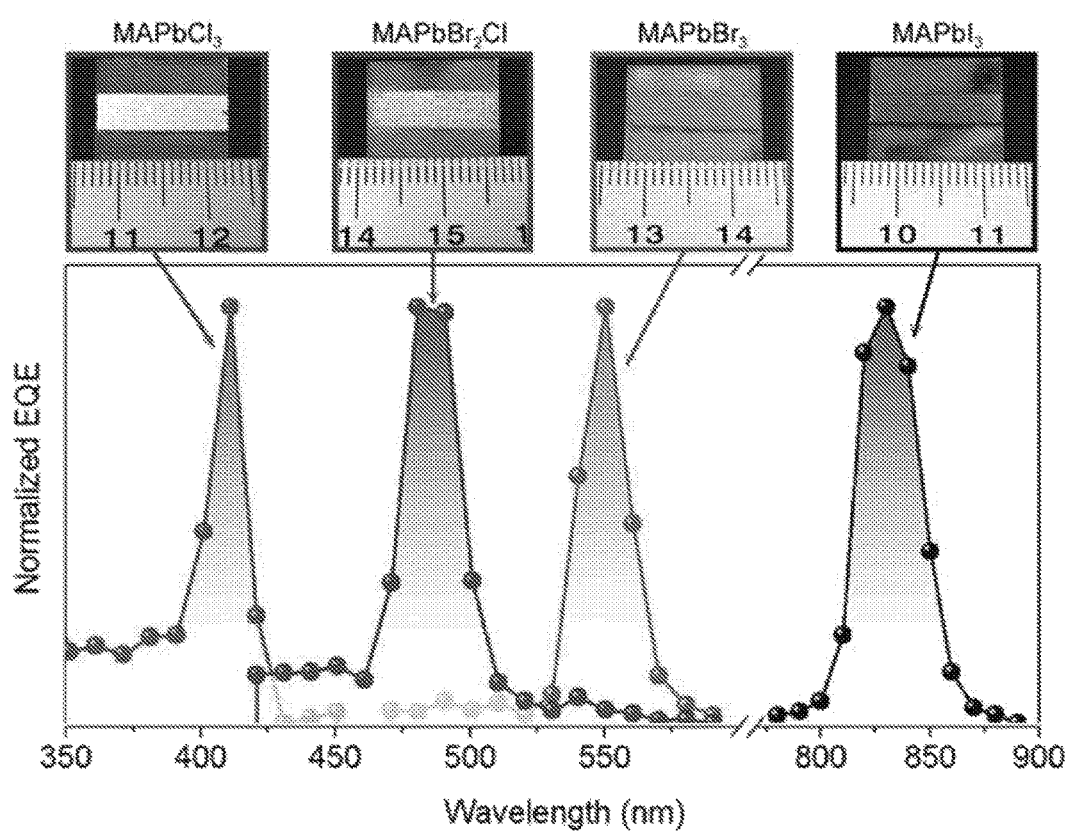
FIG. 3 illustrates tunable response of NBPs. EQE of tuned microcrystalline films upon top illumination. Photo of the devices are also shown.
Figure 11A:
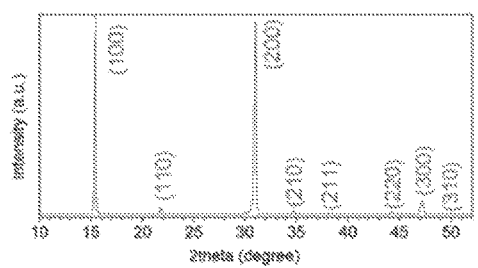
FIG. 11A shows the XRD and 11B shows absorption profiles of microcrystalline $MAPbBr_2Cl$ films.
Figure 11B:
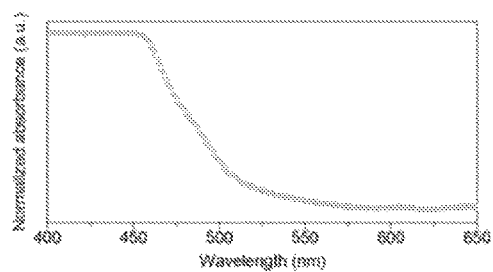

Finally, taking advantage of the rich variety of perovskite chemistry, we demonstrated the spectral tenability of the sensitivity range in our photodetectors. In particular, we studied microcrystalline MAPbBr$_3$ and MAPbCl$_3$ photodetectors prepared using the method developed in this work. XRD of these films confirmed the cubic phase in agreement with the literature (FIG. S7).[17] The absorption edges are located at 570 nm and 425 nm for MAPbBr$_3$ and MAPbCl$_3$ films, respectively.[6a, 11a] Photodetectors based on these perovskites showed the consistent bifunctional sensitivity with dependence on the illumination conditions. For all devices, bottom illumination led to wideband photodetection regimes in wavelength below the band edges. Top illumination of the microcrystalline MAPbBr$_3$- and MAPbCl$_3$-based devices showed narrow EQE at λ=530-570 nm and at λ=390-425 nm, respectively, realizing green and violet NBPs (FIG. 3). The detection spectrum range of the photodetectors can be further tuned through using mixed halides. As a proof-of-concept, we synthesized MAPbBr$_2$Cl microcrystalline films. FIGS. 11A-B show XRD and absorption spectra of this material. These films demonstrated WBPs at λ<500 nm and NBPs at λ=450-500 nm, in accordance to the band edge of MAPbBr$_2$Cl (FIG. 3).

In summary, we leveraged on the rapid growth of microcrystalline perovskite films to fabricate photodetectors operating in both wideband (upon bottom illumination) and narrowband regimes (upon top illumination). Present NBPs showed an EQE above $10^4$% and a FWHM of ~33 nm, outperforming those previously reported perovskite-based NBPs. The sensitivity, response speed, gain, and spectral response of WBPs reported here are among the best photodetectors reported to date. We also tuned the response spectrum of the photodetectors by adjusting the halide composition. Overall, the synthetic design of perovskite microcrystalline films and the engineering approach of dual-functional photodetectors demonstrated here represent an important step toward high-performance perovskite-based optoelectronic devices.

Experimental

Chemicals.

Lead bromide (PbBr$_2$, ≥98%), lead iodide (PbI$_2$ 99.999% trace metal basis), methylamine (33 wt. % in absolute ethanol), hydrochloride acid (37 wt. % in water), dimethylsulfoxide (DMSO, anhydrous, ≥99.9%), N—N, ditnethylformatnide (DMF, 99.8%), γ-butyrolactone (GBL, ≥99%), and 1,2-dichlorobenzene (DCB, 99%) were purchased from Sigma Aldrich. Lead chloride (PbCl$_2$, 99%) was ordered from Alfa Aesar. Methylamtnonium bromide (MABr) and methylammonium iodide (MAI) were purchased from Dyesol Limited (Australia). All salts and solvents were used as received. For MACl synthesis, methylamine and hydrochloride acid were mixed in a molar ratio of 1.2:1 in an ice bath for 2 h, then the solvents were removed with a rotary evaporator. The MACl was recrystallized from ethanol solution with diethyl ether three times and was dried at 60° C. under vacuum overnight.

Film Preparation and Characterization.

MAPbI$_3$ microcrystalline films were prepared by the following protocol, 0.866 g of PbI$_2$ and 0.596 g MAI were dissolved in 5 ml GBL, filtered using a polytetrafluoroethylene (PTFE) filter (0.2 µm pore size), mixed with 5 ml DCB, and then poured into a 60 mm crystallizing dish containing the substrates. This crystallizing dish, covered with an aluminum foil, was heated to 110° C. under continuous stirring at 400 rpm. After 30 min, the substrates were removed from the solution and were annealed for 5 min at 150° C. on a hot plate. MAPbBr$_3$ and MAPbCl$_3$ microcrystalline films were synthesized similarly, except 0.375 M solutions in DMF for MAPbBr$_3$ and 1:1 v/v DMF/DMSO for MAPbCl$_3$ were used, along with heating at 80° C. for crystallization. MAPbBr$_2$Cl microcrystalline films were prepared from mixed MAPbBr$_3$ and MAPbCl$_3$ solutions in 2:1 ratio. All solutions and films were prepared in ambient conditions with 55% humidity. Crystal structures of the films were characterized using XRD (Cu—K$_\alpha$ excitation). The absorption spectrum was characterized using a Varian Cary 5000 spectrometer. A Quanta 200 FEG instrument was used to acquire SEM images.

Photodetector Fabrication and Characterization.

An ITO-coated glass substrate was cleaned sequentially with acetone, isopropanol, and de-ionized water and then patterned by a laser to produce a 5 µm (channel width)×1 mm (length) array of devices. The microcrystalline films were deposited on top of the substrate. I-V characteristics were measured using a Keithley 4200 semiconductor analyzer. A white light source with an intensity of 0.5 mW/cm2 was used for the I-V measurements. To measure wavelength-dependent photoresponse, a Newport QE system was used as the light source and a Keithley 2400 source meter was used to measure the photocurrent. During the measurements, a shadow mask was used to confine the illumination onto the device only. An optical power meter was used to determine the power at different wavelengths. The maximum photo response was achieved in the wideband regime at a wavelength ~810 nm and power density of approximately 25 µW/cm$^2$. The responsivity (R) was calculated as R=ΔI/(P·S), where ΔI is the difference between the photocurrent and the dark current, P is the incident power density, and S is the effective illuminated area. EQE was calculated from the responsivity:[18] EQE=R·h·c/(e·λ) where h is Plank's constant, c is the speed of light, e is the electronic charge and λ is the incident light wavelength. Gain is proportional to responsivity: Gain=R·E, where E is the energy of the incident photon in eV.[3c] Detectivity was calculated using the equation D=R/(√2eJ$_{dark}$), where J$_{dark}$ is the dark current density. The noise current was measured with a lock-in amplifier (Stanford Research SR830). The response speed of the photodetector was measured at 5 V bias using an Agilent MSO9104A oscilloscope with pulsed light excitation of 520 nm LED modulated by a function generator (Agilent 81150A). The LDR was calculated as LDR=10 log (P$_{max}$/P$_{min}$) where P$_{max}$ and P$_{min}$ are highest and lowest detectable light intensity in which the photoresponse is linear.[10]

REFERENCES

[1] a) A. Kojima, K. Teshima, Y. Shirai, T. Miyasaka., *J. Am. Chem. Soc.* 2009, 131, 6050; b) J. H. Im, C. R. Lee, J. W. Lee, S. W. Park, N. G. Park, *Nanoscale* 2011, 3, 4088; c) H. S. Kim, C. R. Lee, J. H. Im, K. B. Lee, T. Moehl, A. Marchioro, S. J. Moon, R. Humphry-Baker, J. H. Yum, J. E. Moser, M. Gratzel, N. G. Park, *Sci. Rep.* 2012, 2, 591; d) J. Burschka, N. Pellet, S. J. Moon, R. Humphry-Baker, P. Gao, M. K. Nazeeruddin, M. Gratzel, *Nature* 2013, 499. 316; e) M. Liu, M. B. Johnston, H. J. Snaith, *Nature* 2013, 501, 395.

[2] a) W. Nie, H. Tsai, R. Asadpour, J.-C. Blancon, A. J. Neukirch, G. Gupta, J. J. Crochet, M. Chhowalla, S. Tretiak, M. A. Alam, H.-L. Wang, A. D. Mohite, *Science* 2015, 347, 522; b) M. Ibrahim Dar, M. Abdi-Jalebi, N. Arora, T. Moehl, M. Gratzel, M. K. Nazeeruddin, *Adv. Mater.* 2015, 27, 7221; c) S. Yakunin, L. Protesescu, F. Krieg, M. I. Bodnarchuk, G. Nedelcu, M. Humer, G. De Luca, M. Fiebig, W. Heiss, M. V. Kovalenko, *Nat. Commun.* 2015, 6; d) W. Zhang, M. Anaya, G. Lozano, M. E. Calvo, M. B. Johnston, H. Miguez, H. J. Snaith, *Nano Lett.* 2015, 15, 1698.

[3] a) L. Dou, Y. M. Yang, J. You, Z. Hong, W. H. Chang, G. Li, Y. Yang, *Nat. Commun.* 2014, 5, 5404; b) T. Moehl, H. Im, Y. H. Lee, K. Domanski, F. Giordano, S. M. Zakeeruddin, M. I. Dar, L. P. Heiniger, M. K. Nazeeruddin, N. G. Park, M. Gratzel, *J. Phys. Chem. Lett.* 2014, 5, 3931; c) R. Dong, Y. Fang, J. Chae, J. Dai, Z. Xiao, Q. Dong, Y. Yuan, A. Centrone, X. C. Zeng, J. Huang, *Adv. Mater.* 2015, 27, 1912; d) Y. Fang, J. Huang, *Adv. Mater.* 2015, 27, 2804; e) Y. Lee, J. Kwon, E. Hwang, C. H. Ra, W. J. Yoo, J. H. Ahn, J. H. Park, J. H. Cho, *Adv. Mater.* 2015, 27, 41; f) X. Hu, X. D. Zhang, L. Liang, J. Bao, S. Li, W. L. Yang, Y, Xie, *Adv. Fund. Mater.* 2014, 24, 7373; g) B. R. Sutherland, A. K. Johnston, A. H. Ip, J. X. Xu, V. Adinolfi, P. Kanjanaboos, E. H. Sargent, *ACS Photonics* 2015, 2, 1117; h) M. I. Saidaminov, V. Adinolfi, R. Comin. A. L. Abdelhady, W. Peng, I. Dursun, M. Yuan, S. Hoogland, E. H. Sargent, O. M. Bakr, *Nat. Commun.* 2015, 6, 8724; i) F. Li, C. Ma, H. Wang, W. Hu, W. Yu, A. D. Sheikh, T. Wu, *Nat. Commun.* 2015, 6; j) K. Domanski, W. Tress, T. Moehl, M. Saliba, M. K, Nazeeruddin, M. Grätzel, *Adv. Funct. Mater.* 2015, 25, 6936.

[4] J. H. Noh, S. H. Im, J. H. Heo, T. N. Mandal, S. I, Seok, *Nano Lett.* 2013, 13, 1764.

[5] a) G. Konstantatos, I. Howard, A. Fischer, S. Hoogland, J. Clifford, E. Klem, L. Levina, E. H. Sargent, *Nature* 2006, 442, 180; b) D. Kufer, I. Nikitskiy, T. Lasanta, G. Navickaite, F. H. Koppens, G. Konstantatos, *Adv. Mater.* 2015, 27, 176; c) J. Y. Kim, V. Adinolfi, B. R. Sutherland, O. Voznyy, S. J. Kwon, T. W. Kim, J. Kim, H. Ihee, K. Kemp, M. Adachi, M. Yuan, I. Kramer, D. Zhitomirsky, S. Hoogland, E. H. Sargent, *Nat. Commun.* 2015, 6, 7772.

[6] a) G. Maculan, A. D. Sheikh, A. L. Abdelhady, M. I. Saidaminov, M. A. Haque, B. Murali, E. Alarousu, O. F. Mohammed, T. Wu, O. M. Bakr, *J. Phys. Chem. Lett.*

2015, 6, 3781; b) Y. L. Guo, C. Liu, H. Tanaka, E. Nakamura, *J. Phys. Chem. Lett.* 2015, 6, 535.
[7] S. Yakunin, M. Sytnyk, D. Kriegner, S. Shrestha, M. Richter, G. J. Matt, H. Azimi, C. J. Brabec, J. Stangl, M. V. Kovalenko, W. Heiss, *Nat. Photonics* 2015, 9, 444.
[8] a) Y. J. Fang, Q. F. Dong, Y. C. Shao, Y. B. Yuan, J. S. Huang, *Nat. Photonics* 2015, 9, 679; b) Q. Q. Lin, A. Armin, P. L. Burn, P. Meredith, *Nat. Photonics* 2015, 9, 687; c) A. Sobhani, M. W. Knight, Y. Wang, B. Zheng, N. S. King, L. V. Brown, Z. Fang, P. Nordlander, N. J. Halas, *Nat. Commun.* 2013, 4, 1643.
[9] a) K. J. Baeg, M. Binda, D. Natali, M. Caironi, Y. Y. Noh, *Adv. Mater.* 2013, 25, 4267; b) S. Donati, *Photodetectors: devices, circuits, and applications*, Vol. 12, 2001.
[10] Z. Lian, Q. Yan, Q. Lv, Y. Wang, L. Liu, L. Zhang, S. Pan, Q. Li, L. Wang. L. Sun, *Sci. Rep.* 2015, 5, 16563.
[11] a) M. I. Saidaminov, A. L. Abdelhady, B. Murali, E. Alarousu, V. M. Burlakov, W. Peng, I. Dursun, L. Wang, Y. He, G. Maculan, A. Goriely, T. Wu, O. F. Mohammed, O. M. Bakr. *Nat. Commun.* 2015, 6, 7586; b) T. Zhang, M. Yang, E. E. Benson, Z. Li, J. van de Lagemaat, J. M. Luther, Y. Yan, K. Zhu, Y. Zhao, *Chem. Commun.* 2015, 51, 7820; c) J. M. Kadro, K. Nonomura, D. Gachet, M. Grätzel, A. Hagfeldt. *Sci. Rep.* 2015, 5; d) Y. Liu, Z. Yang, D. Cui, X. Ren, J. Sun, X. Liu, J. Zhang, Q. Wei, H. Fan, F. Yu, X. Zhang, C. Zhao, S. F. Liu, *Adv. Mater.* 2015, 27, 5176; e) M. I. Saidaminov, A. L. Abdelhady, G. Maculan, O. M. Bakr, *Chem. Commun.* 2015, 51, 17658.
[12] N. J. Jeon, J. H. Noh, Y. C. Kim, W. S. Yang, S. Ryu, S. I, Seok, *Nat. Mater.* 2014.
[13] D. Shi, V. Adinolfi, R. Comin, M. Yuan, E. Alarousu, A. Buin, Y. Chen, S. Hoogland, A. Rothenberger, K. Katsiev, Y. Losovyj, X. Zhang, P. A. Dowben, O. F. Mohammed, E. H. Sargent, O. M. Bakr, *Science* 2015, 347, 519.
[14] A. Armin, R. D. Jansen-van Vuuren, N. Kopidakis, P. L. Burn, P. Meredith, *Nat. Commun.* 2015, 6, 6343.
[15] A. Urich, K. Unterrainer, T. Mueller, *Nano Lett.* 2011, 11, 2804.
[16] C. Motta, F. El-Mellouhi, S. Sanvito, *Sci. Rep.* 2015, 5, 12746.
[17] R. Comin, G. Walters, E. S. Thibau, O. Voznyy, Z.-H. Lu, E. H. Sargent, *J. Mat. Chem. C* 2015, 3, 8839.
[18] L. Hu, J. Yan, M. Liao, L. Wu, X. Fang, *Small* 2011, 7, 1012.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim at least the following:

1. A device, comprising:
   a dual-band photodetector having a microcrystalline film deposited on a substrate,
   wherein the microcrystalline film is positioned on a top side of the dual-band photodetector and the substrate is positioned on a bottom side of the dual-band photodetector,
   wherein the microcrystalline film is a halide perovskite,
   wherein the dual-band photodetector is configured to operate as a narrow-band photodetector upon illumination from the top side and the dual-band photodetector is configured to operate as a wide-band photodetector upon illumination from the bottom side.

2. The device of claim 1, wherein
   the halide perovskite is $AMX_3$,
   A is an inorganic or organic monovalent cation,
   M is a divalent cation selected from the group consisting of: Pb, Sn, Cu, Ni, Co, Fe, Mn, Pd, Cd, Ge, Cs, or Eu, and
   X is selected from a halide.

3. The device of claim 1, wherein
   the halide perovskite is selected from the group consisting of: $MAPbI_3$, $MAPbBr_3$, $MAPbBr_2Cl$, $MAPbCl_3$, $FAPbI_3$, $FAPbBr_3$, $FAPbCl_3$, $CsPbI_3$, $CsPbBr_3$, $CsPbCl_3$, $MASnI_3$, $MASnBr_3$, $MASnCl_3$, $FASnI_3$, $FASnBr_3$, $FASnCl_3$, $CsSnI_3$, $CsSnBr_3$, and $CsSnCl_3$,
   MA is methylammonium, and
   FA is formamidinum.

4. The device of claim 1, wherein the substrate is conductive substrate.

5. The device of claim 4, wherein the conductive substrate is selected from indium tin oxide (ITO), fluorinated tin oxide (FTO), or gold.

6. The device of claim 2, wherein the dual-band photodetector is configurable to be tunable by adjusting the perovskite composition AMX3, the halide (X) composition, the A composition, the M composition, or a combination thereof.

7. The device of claim 1, wherein the microcrystalline film has a thickness of 10 to 500 microns and the substrate has a thickness of 1 nm to 1000 nm.

8. The device of claim 1, wherein the top side of the dual-band photodetector is configured to detect light in the red, green, blue, and near-infrared portion of the infrared spectrum.

9. The device of claim 1, wherein the bottom side of the dual-band photodetector is configured to detect light in the visible, UV-light, and X-ray, regions of the light spectrum.

10. A method of making a photodetector, comprising:
    providing precursor materials for a microcrystalline film; and
    depositing a microcrystalline film on a substrate to form a dual-band photodetector,
    wherein the microcrystalline film is positioned on a top side of the dual-band photodetector and the substrate is positioned on a bottom side of the dual-band photodetector,
    wherein the microcrystalline film is a halide perovskite,
    wherein the dual-band photodetector is configured to operate as a narrow-band photodetector upon illumination from the top side and the dual-band photodetector is configured to operate as a wide-band photodetector upon illumination from the bottom side.

11. The method of claim 10, wherein
the halide perovskite is AMX3,
A is an inorganic or organic monovalent cation,
M is a divalent cation selected from the group consisting of: Pb, Sn, Cu, Ni, Co, Fe, Mn, Pd, Cd, Ge, Cs, or Eu, and
X is selected from a halide.

12. The method of claim 10, wherein
the halide perovskite is selected from the group consisting of: $MAPbI_3$, $MAPbBr_3$, $MAPbBr_2Cl$, $MAPbCl_3$, $FAPbI_3$, $FAPbBr_3$, $FAPbCl_3$, $CsPbI_3$, $CsPbBr_3$, $CsPbCl_3$, $MASnI_3$, $MASnBr_3$, $MASnCl_3$, $FASnI_3$, $FASnBr_3$, $FASnCl_3$, $CsSnI_3$, $CsSnBr_3$ and $CsSnCl_3$,
MA is methylammonium, and
FA is formamidinum.

13. The method of claim 10, wherein the substrate is conductive substrate.

14. The method of claim 10, wherein the conductive substrate is selected from indium tin oxide (ITO), fluorinated tin oxide (FTO), or gold.

* * * * *